United States Patent
Strueder et al.

(10) Patent No.: US 8,461,635 B2
(45) Date of Patent: Jun. 11, 2013

(54) DEPFET TRANSISTOR HAVING A LARGE DYNAMIC RANGE

(75) Inventors: Lothar Strueder, Munich (DE); Gerhard Lutz, Munich (DE)

(73) Assignee: Max-Planck-Gesellschaft zur Foerderung der Wissenschaften e.V., Munich (DE)

( * ) Notice: Subject to any disclaimer, the term of this patent is extended or adjusted under 35 U.S.C. 154(b) by 251 days.

(21) Appl. No.: 12/682,611

(22) PCT Filed: Oct. 8, 2008

(86) PCT No.: PCT/EP2008/008489
§ 371 (c)(1),
(2), (4) Date: Apr. 12, 2010

(87) PCT Pub. No.: WO2009/049808
PCT Pub. Date: Apr. 23, 2009

(65) Prior Publication Data
US 2010/0237392 A1    Sep. 23, 2010

(30) Foreign Application Priority Data
Oct. 11, 2007    (DE) .......................... 10 2007 048 890

(51) Int. Cl.
*H01L 31/04*    (2006.01)
(52) U.S. Cl.
USPC .................................. 257/290; 257/E31.053
(58) Field of Classification Search
None
See application file for complete search history.

(56) References Cited

U.S. PATENT DOCUMENTS

| | | | |
|---|---|---|---|
| 4,245,233 A | 1/1981 | Lohstroh | |
| 6,255,680 B1 * | 7/2001 | Nakashiba | 257/290 |
| 2005/0167771 A1 | 8/2005 | Koyama | |
| 2008/0191123 A1 | 8/2008 | Lutz et al. | |

FOREIGN PATENT DOCUMENTS

| | | |
|---|---|---|
| DE | 102005025641 A1 | 12/2006 |
| JP | 58220472 A | 12/1983 |
| JP | 61179574 A | 8/1986 |
| JP | 1286362 A | 11/1989 |
| JP | 07078972 A | 3/1995 |
| WO | 2005074012 A2 | 8/2005 |
| WO | 2006018477 A1 | 2/2006 |
| WO | 2007077287 A1 | 7/2007 |

OTHER PUBLICATIONS

English-language abstract of JP 58220472 A.
English-language abstract of JP 61179574 A.
English-language abstract of JP 01286362 A.
English-language abstract of JP 07078972 A.

(Continued)

*Primary Examiner* — Fei Fei Yeung Lopez
(74) *Attorney, Agent, or Firm* — Caesar, Rivise, Bernstein, Cohen & Pokotilow, Ltd.

(57) ABSTRACT

The invention relates to a DEPFET transistor (1) for detecting a radio-generated signal charge (2) and for generating an electronic output signal in a manner dependent on the detected signal charge (2) according to a predetermined characteristic curve. The invention provides for the characteristic curve to have a degressive characteristic curve profile in order to combine a high measurement sensitivity in the case of small signal charges (2) with a large measurement range through to large signal charges (2).

29 Claims, 7 Drawing Sheets

OTHER PUBLICATIONS

Lutz et al., "DEPFET Detector-Amplifier Structure: Properties, Achievements and New Developments, Concepts and Applications", 2007 IEEE Nuclear Symposium Conference Record, pp. 988-994 (2007).

Lutz, "Semiconductor Radiation Detectors", 2nd Edition, pp. 234-253 (2001).

Zhang et al., "Development of DEPFET Macropixel detectors", Nuclear Instruments and Methods in Physics Research A, vol. 568, pp. 207-216 (2006).

International Search Report for PCT/EP2008-008489.

* cited by examiner

DEPFET TRANSISTOR HAVING A LARGE DYNAMIC RANGE

BACKGROUND OF THE INVENTION

The invention relates to a DEPFET transistor.

In semiconductor detectors for high sensitivity radiation detection, DEPFET transistors (DEPFET: Depleted Field Effect Transistor) are used as the readout element, these having been invented in 1984 by J. Kemmer and G. Lutz and being described for example in Gerhard Lutz: "Semiconductor Radiation Detectors", 2nd edition, Springer-Verlag 2001, 234-253.

The radiation to be detected here generates signal charge carriers in the semiconductor detector, which signal charge carriers are detected by the DEPFET transistor serving as a readout element. The DEPFET transistor then generates an output signal (e.g. source voltage) as a function of the radiation-generated signal charge carriers in accordance with a specific characteristic curve, which output signal forms a measure for the radiation to be detected.

In such semiconductor detectors a non-linear characteristic curve is desirable, with a steep characteristic curve slope in the case of small signal charges and a gentle characteristic curve slope in the case of large signal charges.

The steep characteristic curve slope in the case of small signal charges is advantageous, since then small signal charges and correspondingly weak levels of radiation may be measured with high measurement sensitivity.

The gentle characteristic curve slope in the case of large signal charges is advantageous, on the other hand, because otherwise the measurement range would be exceeded by large signal charges.

Such a non-linear characteristic curve thus advantageously combines high measurement sensitivity in the case of small signal charges with a large measurement range.

This non-linear characteristic curve is achieved in the case of conventional semiconductor detectors by a suitable electrical connection arrangement for the semiconductor detector, such as for example by non-linearity in the feedback branch or an amplifier range changeover as a function of the detected signal. Such a semiconductor detector is known from DE 10 2005 025 641 A1.

A disadvantage of known semiconductor detectors with a DEPFET transistor as readout element is therefore the fact that the desired non-linear characteristic curve has to be achieved by a separate electrical connection arrangement, which is associated with additional circuit complexity.

A semiconductor detector is also known from WO 2007/077287 A1, which does not however comprise a DEPFET transistor.

Finally, reference is also made to US 2005/0167771 A1 as general prior art.

The object of the invention is therefore to reduce the effort required to bring about the desired non-linear characteristic curve for a semiconductor detector.

This object is achieved by a DEPFET transistor according to the invention.

SUMMARY OF THE INVENTION

The invention comprises the general technical teaching of achieving the desired non-linear characteristic curve of the semiconductor detector not through a separate electrical connection arrangement for the semiconductor detector, but rather through a suitable design of the DEPFET transistor used as readout element.

This advantageously allows the circuit previously required for producing the desired non-linear characteristic curve of the semiconductor detector to be dispensed with, but the invention also claims protection for semiconductor detectors in which a connection arrangement is additionally provided in order to influence the characteristic curve.

The invention therefore provides a DEPFET transistor which serves to detect a radiation-generated signal charge and, as a function of the detected signal charge, generates an electrical output signal (e.g. source voltage) in accordance with a predetermined characteristic curve, the characteristic curve comprising a degressive characteristic curve profile, in order to combine high measurement sensitivity in the case of small signal charges with a large measurement range up to large signal charges.

The term "degressive characteristic curve profile" used for the purposes of the invention preferably means that the characteristic curve slope (i.e. the differential quotient of output signal and signal charge) decreases from small signal charges towards large signal charges. The invention is not however restricted to those embodiments in which the characteristic curve slope decreases with the signal charge over the entire measurement range. Instead, the invention also comprises those embodiments in which the characteristic curve slope comprises local maxima within the measurement range, provided that the characteristic curve slope exhibits a trend within the measurement range which decreases with the signal charge.

Furthermore, the output signal concept used for the purposes of the invention is not limited to the source voltage of the DEPFET transistor. Instead, other electrical variables are also possible as output signal, such as the drain current.

In one variant of the invention the characteristic curve is substantially kink-free within the measurement range, such that the characteristic curve slope varies continuously within the measurement range. For example, the characteristic curve profile may display root or logarithmic dependence on the signal charge.

In another variant of the invention the characteristic curve on the other hand comprises a plurality of preferably linear characteristic curve portions with different characteristic curve slopes, the characteristic curve slope of the individual characteristic curve portions decreasing with the signal charge. This means that the individual characteristic curve portions in each case display a gentler characteristic curve slope than the preceding characteristic curve portion in a region with relatively low signal charge.

The DEPFET transistor may be of conventional construction apart from the degressive characteristic curve profile provided according to the invention, such that reference is made to the publication by Gerhard Lutz already mentioned above: "Semiconductor Radiation Detectors", 2nd edition, Springer-Verlag 2001, 234-253. The content of this publication is therefore to be included in its entirety in the present description with regard to the structure and mode of operation of a DEPFET transistor.

The DEPFET transistor according to the invention thus preferably has a semiconductor substrate with a front and a back, a source and a drain being arranged on the front of the semiconductor substrate, between which there extends a controllable conductive channel.

On the one hand, the conductivity of the conductive channel may be controlled conventionally by an external gate, which is arranged on the front of the semiconductor substrate above the conductive channel.

On the other hand, the conductivity of the DEPFET transistor conductive channel may be controlled by an internal gate, which is arranged in the semiconductor substrate at least partially under the conductive channel and is doped with a specific doping level, the radiation-generated signal charge accumulating in the internal gate and thereby controlling the conductivity of the conductive channel.

It should here be mentioned that in practice the internal gate is not sharply delimited spatially relative to the surrounding semiconductor substrate. As a rule, it is the doping level within the semiconductor substrate that rather changes continuously, the internal gate being formed by a spatial region within which the doping level exceeds a specific limit value.

Furthermore, the DEPFET transistor according to the invention preferably comprises a back contact, which is arranged on the back of the semiconductor substrate, in order to deplete the semiconductor substrate.

As a distinctive feature relative to conventional DEPFET transistors, the invention preferably provides for the internal gate to extend in a lateral direction beyond the conductive channel to under the source. The signal charge then initially accumulates in the region of the internal gate, which lies under the conductive channel, where the accumulated signal charge greatly influences the conductivity of the conductive channel, leading to a steep characteristic curve slope of the DEPFET transistor. With an increasing signal charge in the internal gate, part of the signal charge accumulated in the internal gate is then no longer located in the region under the conductive channel, but rather in the region under the source, where the signal charge influences the conductivity of the conductive channel to a significantly lesser extent, leading to a correspondingly gentler characteristic curve slope.

The doping level may here be varied laterally within the internal gate, in order to influence the characteristic curve profile in the desired manner. Preferably the doping level in the internal gate is here greater under the conductive channel than under the source, so as to achieve the desired degressive characteristic curve profile.

Furthermore, for the purposes of the invention there is also the possibility of varying the vertical extent of the internal gate in a lateral direction, in order to influence the characteristic curve profile. For example, the internal gate may have a greater vertical extent under the conductive channel than under the source, such that the vertical extent of the internal gate reduces in a lateral direction from the region under the conductive channel towards the source.

The doping level or the vertical extent of the internal gate may here be changed continuously in a lateral direction in order to achieve a correspondingly continuous characteristic curve profile.

It is alternatively possible for the doping level or the vertical extent of the internal gate to be changed stepwise in a lateral direction, in order to achieve a characteristic curve profile with a plurality of linear characteristic curve portions with different characteristic curve slopes.

For the purposes of the invention the doping profile of the internal gate may thus be adjusted in such a way as a function of the depth in the semiconductor substrate and/or the lateral position with regard to the conductive channel that the desired degressive characteristic curve is achieved.

Furthermore, it is possible for the purposes of the invention for the internal gate to extend in a lateral direction beyond the conductive channel to under the drain, but this is not absolutely essential.

In addition, it is possible for the purposes of the invention for the internal gate to extend in the semiconductor substrate, starting from the region under the source as far as the region under the conductive channel, increasingly far downwards into the semiconductor substrate. Here the internal gate thus extends deeper into the semiconductor substrate in the region under the conductive channel than in the region under the source. Preferably, the internal gate here extends in a lateral direction beyond the conductive channel as far as under the source only at its top, while at its bottom the internal gate is limited laterally to the region under the conductive channel and does not extend as far as under the source. The internal gate here preferably forms a potential well, which fills with the radiation-generated signal charge upon radiation detection, the accumulated signal charge also extending as far as under the source as the degree of filling of the potential well increases.

In another variant of the invention, on the other hand, the internal gate extends, starting from the region under the source in a lateral direction as far as the region under the conductive channel, increasingly far upwards into the semiconductor substrate. In this case, the internal gate preferably extends in a lateral direction beyond the conductive channel as far as under the source only at its bottom, while at its top the internal gate does not extend laterally as far as under the source but rather is limited to the region under the conductive channel.

In addition, it is possible for the purposes of the invention for the internal gate to extend at a specific depth in the semiconductor substrate, the depth decreasing from the region under the conductive channel towards the region under the source. In this case, the internal gate thus extends at a greater depth under the conductive channel than under the source, so achieving the desired non-linear characteristic curve profile.

The DEPFET transistor according to the invention is thus distinguished in that the measurement sensitivity (i.e. the differential quotient of signal charge or incident radiation on the one hand and the resultant electrical output signal on the other hand) decreases with the accumulated signal charge. In this way, considerable measurement sensitivity in the case of small signal charges is combined with a large measurement range up to large signal charges.

It should additionally be mentioned that the same options are available with regard to doping conditions as with the above-mentioned conventional DEPFET transistors. The semiconductor substrate and the internal gate are thus doped in accordance with a first doping type, while the source, the drain and the back contact are doped in accordance with a second doping type. The first doping type is preferably n-doping, while the second doping type is preferably p-doping. It is alternatively also possible, however, for the first doping type to be p-doping, while the second doping type is n-doping.

It should additionally be mentioned that the DEPFET transistor according to the invention may be of either linear or annular construction, which is already sufficiently well known per se from the prior art and does not therefore have to be described in greater detail.

Finally, the invention also comprises a semiconductor detector for radiation detection having the above described DEPFET transistor according to the invention, wherein the DEPFET transistor may be used in the semiconductor detector as a readout element and/or as a radiation-detecting detector element.

The semiconductor detector here preferably comprises a large number of detector elements, which are arranged in a matrix, wherein the individual detector elements each form one pixel and preferably consist of a DEPFET transistor according to the invention with a degressive characteristic curve.

BRIEF DESCRIPTION OF SEVERAL VIEWS OF THE DRAWINGS

Other advantageous further developments of the invention are identified in the dependent claims or are explained in greater detail below with reference to the Figures together with the description of the preferred exemplary embodiments of the invention. In the drawings:

DETAILED DESCRIPTION OF PREFERRED EMBODIMENTS

Figure 1:
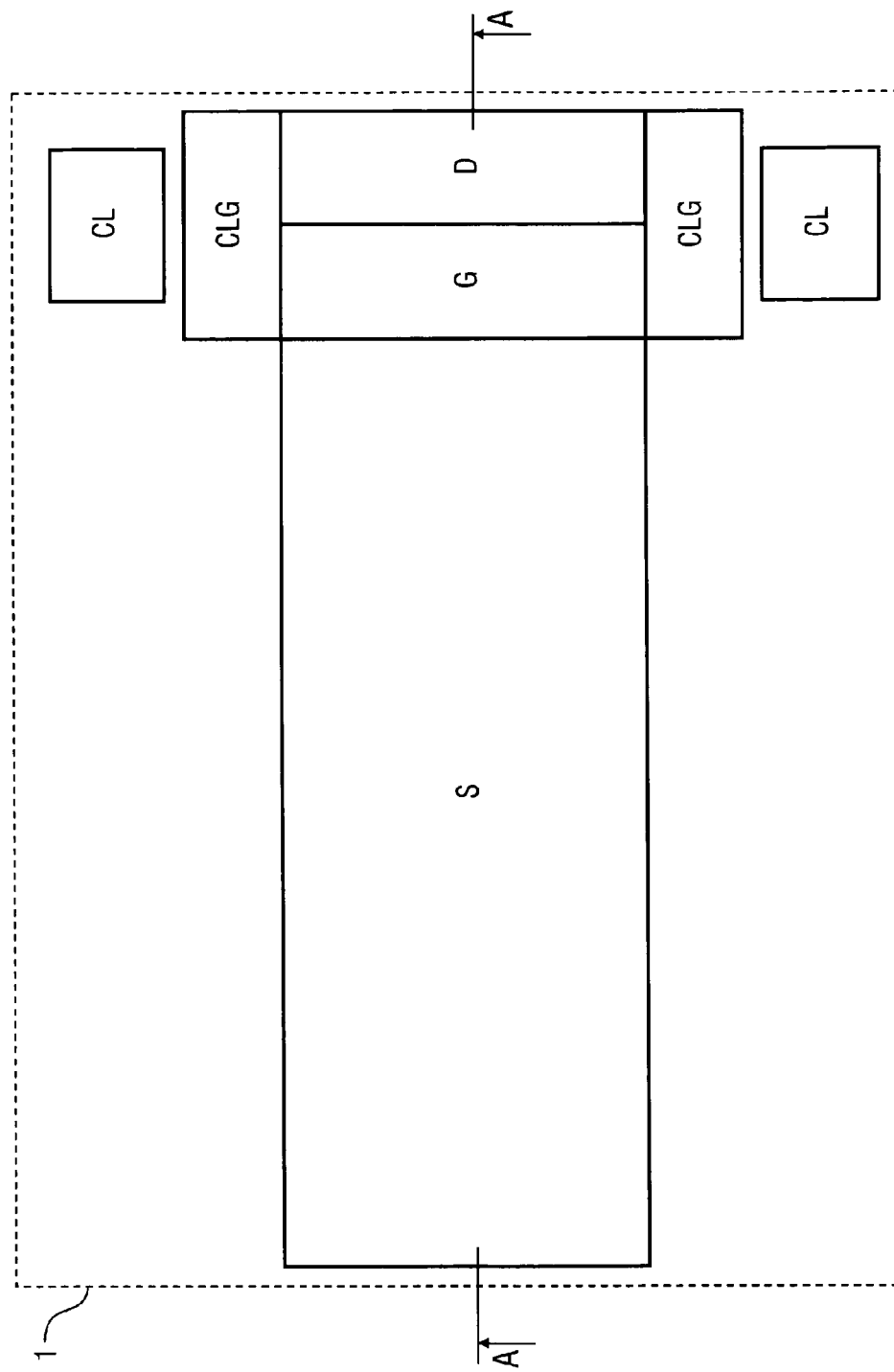
FIG. 1 is a simplified plan view of a DEPFET transistor according to the invention.
Figure 2:
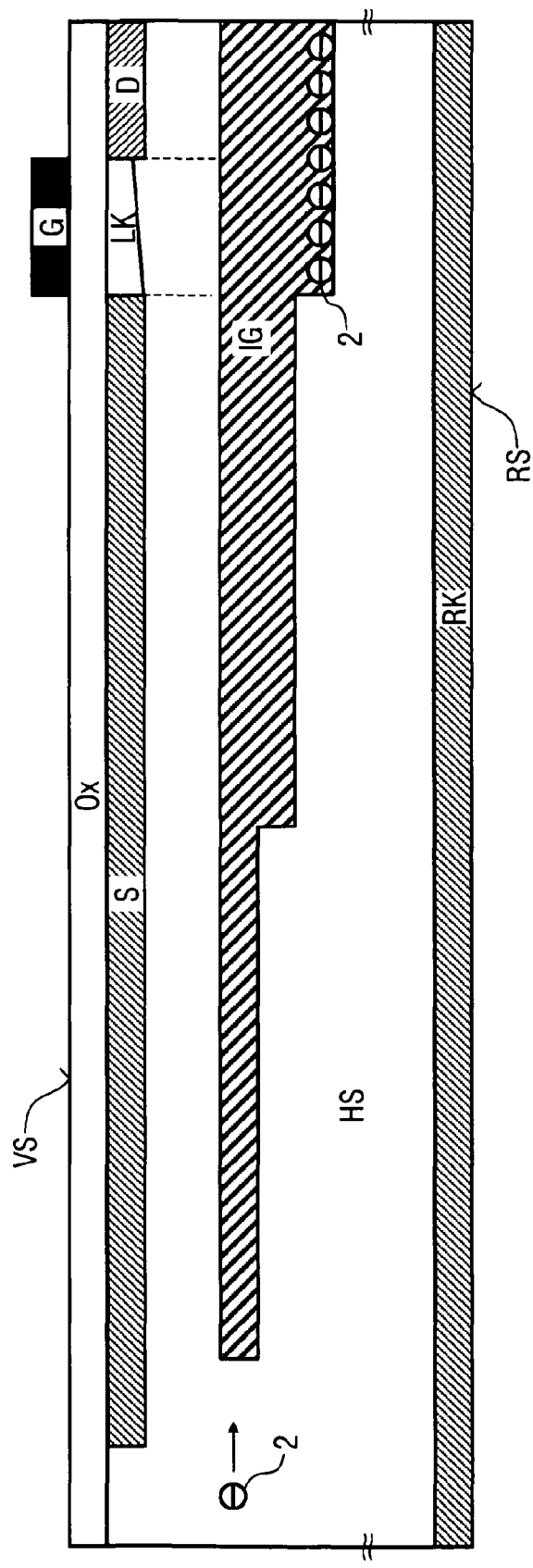
FIG. 2 is a simplified cross-sectional view of the DEPFET transistor according to FIG. 1 along section line A-A.

FIGS. 1 and 2 show in simplified, idealized form a DEPFET transistor 1 in plan view and in cross-sectional view respectively.

The DEPFET transistor 1 here serves as a readout element in a semiconductor detector, the remaining structure of the semiconductor detector not being shown for the purpose of simplification.

The DEPFET transistor 1 comprises a weakly n-doped semiconductor substrate HS with a front VS and a back RS.

On the back RS of the semiconductor substrate HS there is in this case located an extensive back contact RK, which consists of a heavily p-doped area and with the n-doped semiconductor substrate HS forms a diode polarized in the reverse direction and serves to deplete the semiconductor substrate HS. When operating the DEPFET transistor 1, a positive electrical potential is therefore applied to the back contact RK, in order to deplete the semiconductor substrate HS.

On the front VS, the semiconductor substrate HS is covered and insulated by an oxide layer Ox, which is known per se from the prior art. However, the oxide layer Ox comprises interruptions, in order electrically to contact the source S and the drain D, which is not apparent from this cross-sectional drawing.

Furthermore, a heavily p-doped source S and a likewise heavily p-doped drain D are located on the front VS of the semiconductor substrate HS, a conductive channel LK extending between the source S and the drain D, the conductivity of which channel may be controlled.

On the one hand, the conductivity of the conductive channel LK may be controlled by an external gate G, which is arranged on the front VS above the oxide layer Ox.

On the other hand, the conductivity of the conductive channel LK may be controlled by an internal gate IG, which is arranged in the semiconductor substrate HS and consists of a buried n-doped area, in which radiation-generated signal charge carriers 2 accumulate.

A distinctive feature of the DEPFET transistor 1 according to the invention consists in the fact that the internal gate IG is not limited laterally to the region under the conductive channel, but rather extends in a lateral direction to under the source S and also to under the drain D. This is important because the signal charge carriers 2, which are located in the internal gate IG under the source S, contribute to a significantly lesser extent to control of the conductivity of the conductive channel LK than the signal charge carriers 2 located in the internal gate IG under the conductive channel LK.

The internal gate IG extends further in depth under the conductive channel LK than under the source S, such that the internal gate IG has a greater vertical extent under the conductive channel LK than under the source S. The consequence of this is that the radiation-generated signal charge carriers 2 accumulate in the internal gate IG initially in the region under the conductive channel LK and there contribute to a relatively significant extent to control of the conductivity of the conductive channel LK. Only with an increasing amount of signal charge are signal charge carriers 2 then also to be found in the internal gate IG in the region under the source S, where they contribute however to a significantly lesser extent to control of the conductivity of the conductive channel LK.

Figure 7:
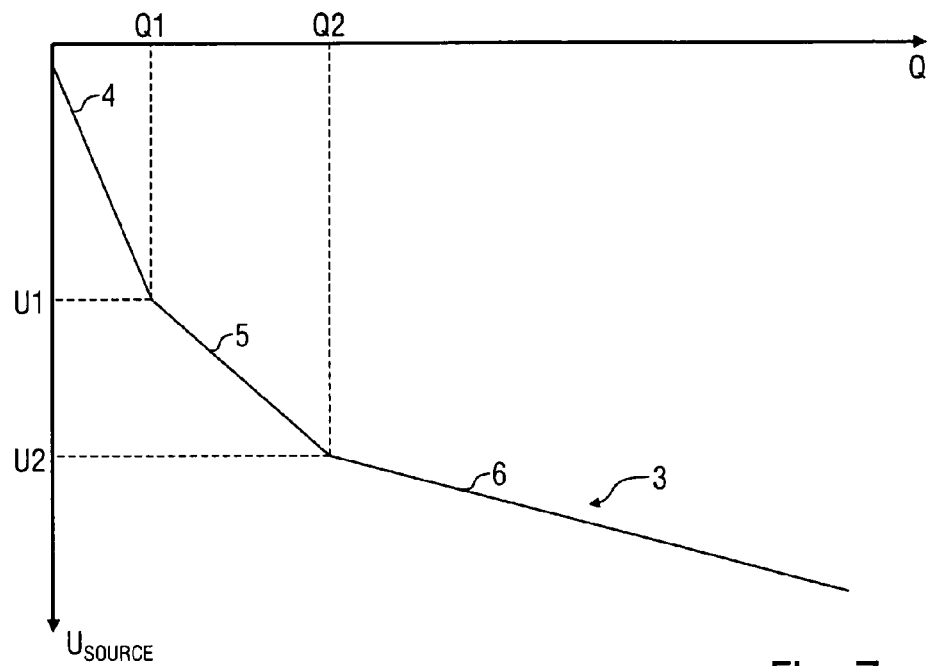
FIG. 7 shows a simplified, idealized representation of a characteristic curve profile in the case of the above-described exemplary embodiments of a DEPFET transistor according to the invention

The internal gate IG here comprises three regions in a lateral direction which are separated from one another in each case by a step, so leading to a characteristic curve 3 as shown in FIG. 7. The characteristic curve 3 thus shows the dependence of the source voltage $U_{SOURCE}$ on the radiation-generated signal charge Q. It is apparent from the drawing that the characteristic curve 3 comprises a plurality of characteristic curve portions 4, 5, 6 with different characteristic curve slopes, wherein the characteristic curve slope decreases with the signal charge Q, such that the characteristic curve 3 comprises overall a degressive characteristic curve profile. This is advantageous because in the case of small signal charges Q<Q1 in the characteristic curve portion 4 a steep characteristic curve slope with correspondingly great measurement sensitivity is thereby available, while the characteristic curve slope decreasing towards larger signal charges allows a large measurement range.

From the plan view in FIG. 1 it is furthermore apparent that the DEPFET transistor 1 has a linear structure and additionally has a clear gate CLG, which is arranged laterally next to the conductive channel LK or the external gate G.

Furthermore, the DEPFET transistor 1 has two clear contacts CL, which remove the signal charge carriers 2 accumulated in the internal gate IG via the clear gate CLG in a clear process.

However, other methods may also be used for the clear process for the DEPFET transistor 1 according to the invention, these being known per se from the prior art known and not therefore needing to be described in any greater detail.

Figure 3:
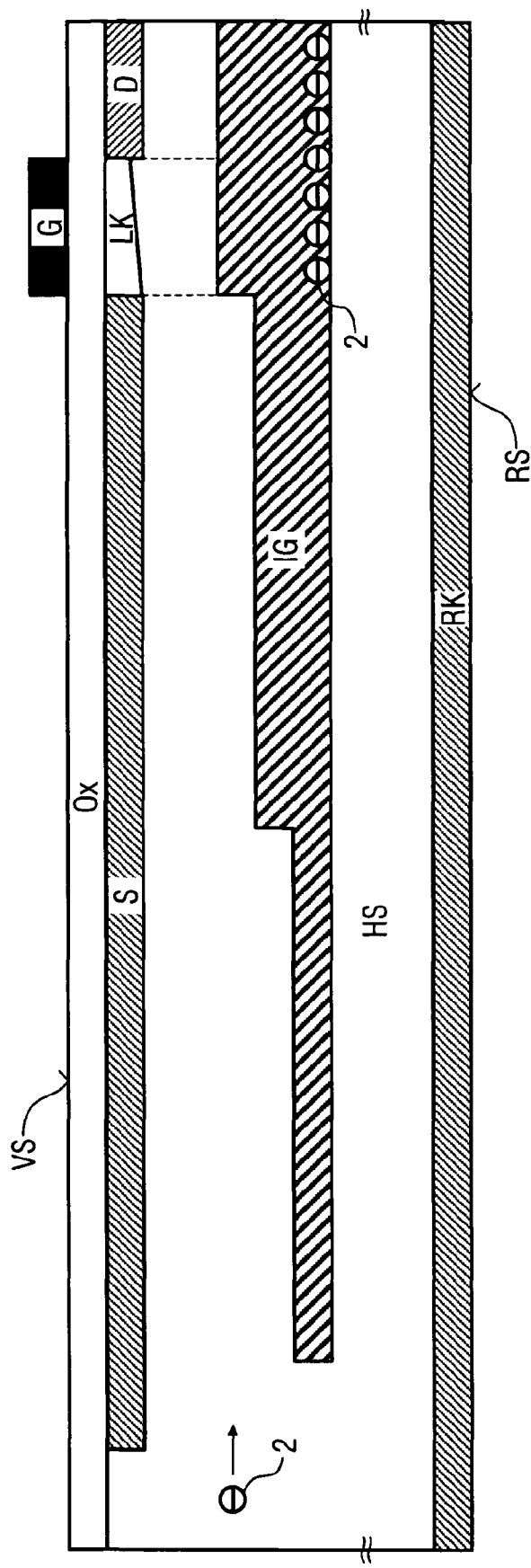
FIG. 3 shows a modification of the cross-sectional view of FIG. 1, the internal gate extending further upwards under the conductive channel than under the source.

FIG. 3 shows a cross-sectional view of an alternative embodiment of the DEPFET transistor 1, which corresponds largely to the exemplary embodiment described above, such that, to avoid repetition, reference is made to the above description, the same reference numerals being used for matching details.

A distinctive feature of this exemplary embodiment is that the internal gate IG extends, starting from the region under the source S in a lateral direction towards the region under the conductive channel LK, increasingly far upwards towards the front VS. The vertical extent of the internal gate IG is thus at its greatest in the region under the conductive channel LK and decreases in a lateral direction towards the source S.

Figure 4:
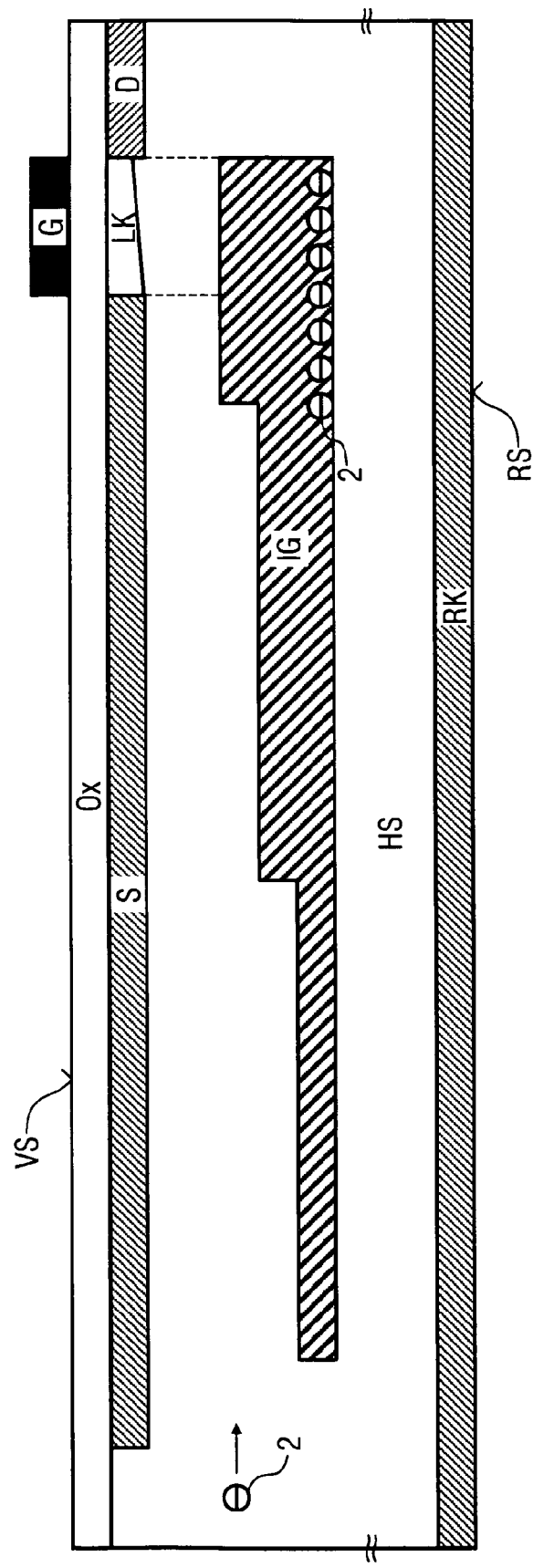
FIG. 4 shows a modification of the cross-sectional view of FIG. 3, the internal gate not extending laterally as far as under the drain.

FIG. 4 shows a modification of FIG. 3, such that, to avoid repetition, reference is made to the above description, the same reference numerals being used for matching details.

A distinctive feature of this exemplary embodiment is that the internal gate IG does not extend in a lateral direction as far as under the drain D.

Figure 5:
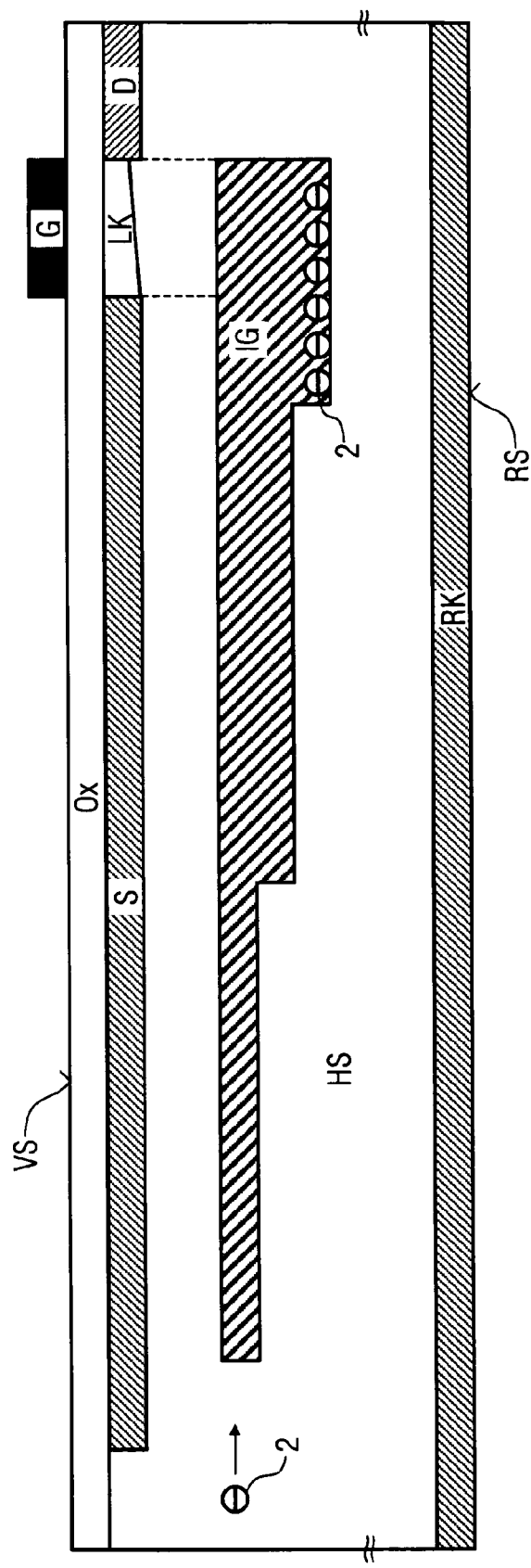
FIG. 5 shows a modification of the cross-sectional view of FIG. 2, the internal gate not extending laterally as far as under the drain.

FIG. 5 shows a modification of the cross-sectional view of FIG. 2, such that, to avoid repetition, reference is made to the above description, the same reference numerals being used for matching details.

A distinctive feature of this exemplary embodiment is likewise that the internal gate IG does not extend in a lateral direction as far as under the drain D.

Figure 6:
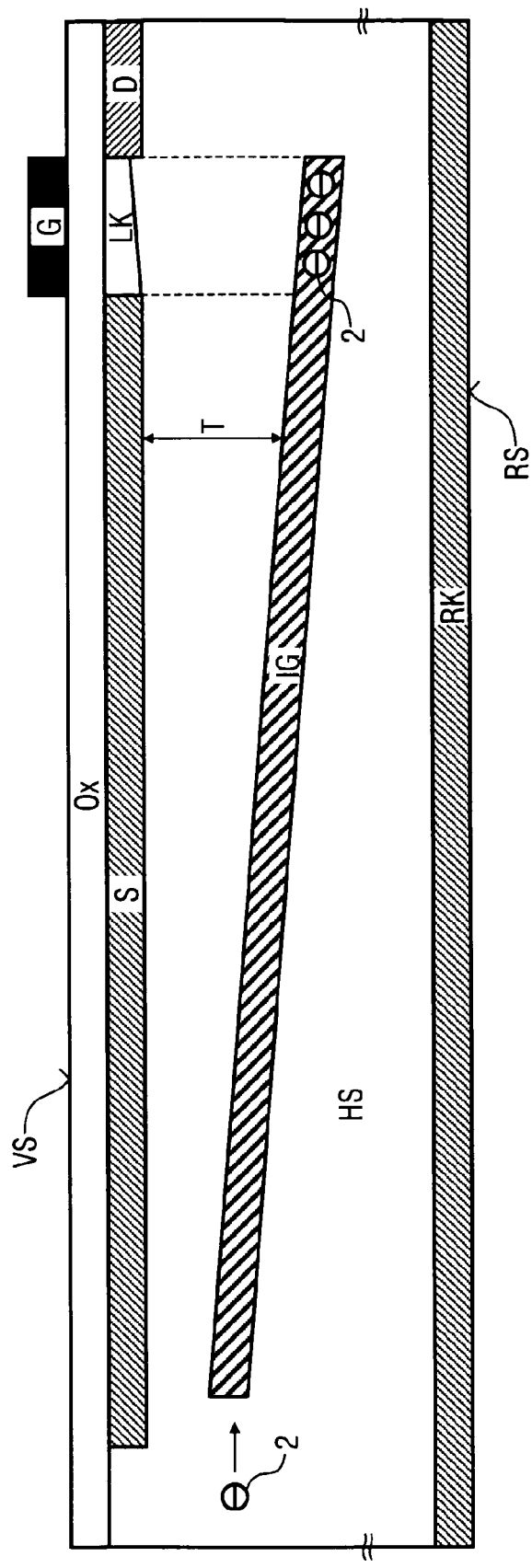
FIG. 6 is a cross-sectional view of an alternative exemplary embodiment, in which the depth of the internal gate varies in a lateral direction and is at its greatest under the conductive channel.

FIG. 6 shows a cross-sectional view of a further exemplary embodiment of a DEPFET transistor 1 according to the invention, which corresponds largely to the above-described exemplary embodiments, such that, to avoid repetition, reference is made to the above description, the same reference numerals being used for matching details.

A distinctive feature of this exemplary embodiment is that the internal gate IG extends in the semiconductor substrate HS at a specific depth T, wherein the depth T varies in a lateral direction and is at its greatest in the region under the conductive channel LK.

The depth T then decreases in a lateral direction towards the source S, whereby the characteristic curve profile of the DEPFET transistor 1 is likewise influenced in the desired manner.

Figure 8:
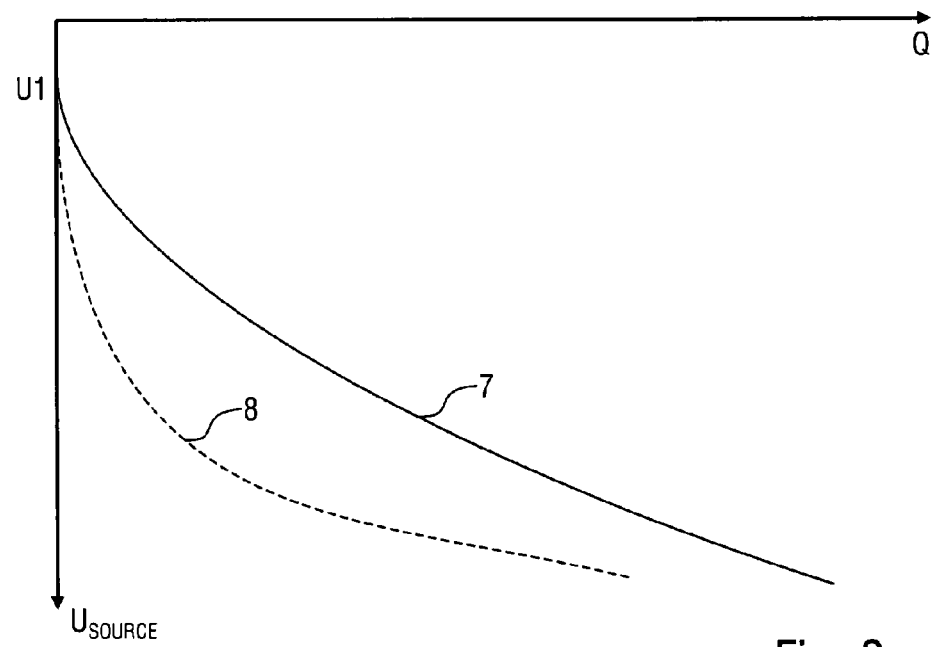
FIG. 8 shows alternative characteristic curve profiles of DEPFET transistors according to the invention.

Finally, FIG. 8 shows two alternative degressive characteristic curves 7, 8 of a DEPFET transistor according to the invention. The characteristic curve 7 here comprises root dependence of the source voltage $U_{SOURCE}$ on the signal charge Q, while the characteristic curve 8 displays logarithmic dependence of the source voltage $U_{SOURCE}$ on the signal charge Q.

The invention is not limited to the above-described preferred exemplary embodiments. Instead, many variants and modifications are possible, which also make use of the concept of the invention and thus fall within the scope of protection.

LIST OF REFERENCE NUMERALS

1 DEPFET transistor
2 Signal charge carriers
3 Characteristic curve
4-6 Characteristic curve portions
7 Root characteristic curve
8 Logarithmic characteristic curve
CL Clear contacts
CLG Clear gate
D Drain
G External gate
HS Semiconductor substrate
LK Conductive channel
Ox Oxide layer
RK Back contact
RS Back
S Source
VS Front

The invention claimed is:

1. A depleted field effect (DEPFET) transistor for detecting a radiation-generated signal charge and for generating an electric output signal as a function of the detected signal charge in accordance with a predetermined characteristic curve, wherein the characteristic curve displays a degressive characteristic curve profile, in order to combine a high measurement sensitivity in the case of small charges with a large measurement range up to large signal charges, wherein the characteristic curve displays root dependence on the signal charge.

2. A depleted field effect (DEPFET) transistor for detecting a radiation-generated signal charge and for generating an electrical output signal as a function of the detected signal charge in accordance with a predetermined characteristic curve, wherein the characteristic curve displays a degressive characteristic curve profile, in order to combine a high measurement sensitivity in the case of small signal charges with a large measurement range up to large signal charges, wherein the characteristic curve displays logarithmic dependence on the signal charge.

3. A depleted filed effect (DEPFET) transistor for detecting a radiation-generated signal charge and for generating an electric output signal as a function of the detected signal charge in accordance with a predetermined characteristic curve, wherein the characteristic curve displays a degressive characteristic curve profile, in order to combine a high measurement sensitivity in the case of small signal charges with a large measurement range up to large signal charges, further comprising a) a semiconductor substrate with a front and a back,
b) a source, which is arranged on the front of the semiconductor substrate,
c) a drain, which is arranged on the front of the semiconductor substrate at a distance from the source,
d) a conductive channel, which extends on the front of the semiconductor substrate between the source and the drain and displays controllable conductivity,
e) an internal gate, which is arranged in the semiconductor substrate at least partially under the conductive channel and is doped with a specific doping level, the radiation-generated signal charge accumulating in the internal gate and thereby controlling the conductivity of the conductive channel,
f) an external gate arranged on the front of the semiconductor substrate above the conductive channel, for controlling the conductivity of the conductive channel, and
g) a back contact, which is arranged on the back of the semiconductor substrate, so as to deplete the semiconductor substrate.

4. The DEPFET transistor according to claim 3, wherein the internal gate extends in a lateral direction beyond the conductive channel to under the source.

5. The DEPFET transistor according to claim 3, wherein the internal gate displays a greater doping level under the conductive channel than under the source.

6. The DEPFET transistor according to claim 3, wherein the internal gate comprises a greater vertical extent under the conductive channel than under the source.

7. The DEPFET transistor according to claim 5, wherein the doping level in the internal gate decreases in a lateral direction from a region under the conductive channel towards the region under the source.

8. The DEPFET transistor according to claim 5, wherein a vertical extent of the internal gate decreases in a lateral direction from a region under the conductive channel towards the region under the source.

9. The DEPFET transistor according to claim 7, wherein the doping level and a vertical extent of the internal gate changes continuously in a lateral direction.

10. The DEPFET transistor according to claim 7, wherein the doping level and a vertical extent of the internal gate changes stepwise in a lateral direction.

11. The DEPFET transistor according to claim 3, wherein the internal gate extends in a lateral direction beyond the conductive channel as far as under the drain.

12. The DEPFET transistor according to claim 3, wherein the internal gate does not extend in a lateral direction as far as under the drain.

13. The DEPFET transistor according to claim 3, wherein the internal gate extends, starting from a region under the source to the region under the conductive channel, increasingly far downwards into the semiconductor substrate.

14. The DEPFET transistor according to claim 3, wherein at its top the internal gate extends in a lateral direction beyond the conductive channel as far as under the source.

15. The DEPFET transistor according to claim 3, wherein at its bottom the internal gate does not extend in a lateral direction as far as under the source.

16. The DEPFET transistor according to claim 3, wherein the internal gate extends, starting from a region under the source in a lateral direction to the region under the conductive channel, increasingly far upwards into the semiconductor substrate.

17. The DEPFET transistor according to claim 3, wherein at its bottom the internal gate extends in a lateral direction beyond the conductive channel as far as under the source.

18. The DEPFET transistor according to claim 3, wherein at its top the internal gate does not extend in a lateral direction as far as under the source.

19. The DEPFET transistor according to claim 3, wherein the internal gate extends in the semiconductor substrate at a specific depth, wherein the depth decreases from a region under the conductive channel towards the region under the source.

20. The DEPFET transistor according to claim 3, wherein
 a) the semiconductor substrate and the internal gate are doped in accordance with a first doping type, and
 b) the source, the drain and the back contact are doped in accordance with a second doping type.

21. The DEPFET transistor according to claim 20, wherein the first doping type is n-doping, while the second doping type is p-doping.

22. The DEPFET transistor according to claim 20, wherein the first doping type is p-doping, while the second doping type is n-doping.

23. The DEPFET transistor according to claim 3, wherein the internal gate comprises a specific doping profile, which is selected such that the characteristic curve profile is degressive.

24. A semiconductor detector for radiation detection, further comprising at least one DEPFET transistor according to claim 1.

25. The semiconductor detector according to claim 24, wherein the DEPFET transistor forms a readout element.

26. The semiconductor detector according to claim 24, wherein the DEPFET transistor forms a radiation-detecting detector element.

27. The semiconductor detector according to claim 26, wherein a large number of detector elements is arranged in the form of a matrix.

28. A semiconductor detector for radiation detection, further comprising at least one DEPFET transistor according to claim 2.

29. A semiconductor detector for radiation detection, further comprising at least one DEPFET transistor according to claim 3.

* * * * *